US012598868B2

(12) United States Patent
Kang et al.

(10) Patent No.: US 12,598,868 B2
(45) Date of Patent: Apr. 7, 2026

(54) DISPLAY DEVICE

(71) Applicant: LG Display Co., Ltd., Seoul (KR)

(72) Inventors: SeongHo Kang, Seoul (KR); JeongOh Kim, Goyang-si (KR); MyungJae Yoo, Paju-si (KR); Geumyoung Lee, Gimpo-si (KR)

(73) Assignee: LG Display Co., Ltd., Seoul (KR)

( * ) Notice: Subject to any disclaimer, the term of this patent is extended or adjusted under 35 U.S.C. 154(b) by 444 days.

(21) Appl. No.: 18/059,942

(22) Filed: Nov. 29, 2022

(65) Prior Publication Data

US 2023/0209908 A1 Jun. 29, 2023

(30) Foreign Application Priority Data

Dec. 28, 2021 (KR) ........................ 10-2021-0189459

(51) Int. Cl.
*H10K 59/122* (2023.01)

(52) U.S. Cl.
CPC .................................. *H10K 59/122* (2023.02)

(58) Field of Classification Search
CPC .................................................. H10K 59/122
See application file for complete search history.

(56) References Cited

U.S. PATENT DOCUMENTS

2006/0076887 A1* 4/2006 Kang ................. H10K 50/8426
313/512
2013/0187163 A1* 7/2013 Kim ..................... H10K 50/856
438/34

2019/0189718 A1* 6/2019 Lee ...................... H10K 59/131
2023/0060667 A1* 3/2023 You ...................... H10K 59/123

FOREIGN PATENT DOCUMENTS

| KR | 20160053343 | A | 5/2016 |
|----|-------------|---|--------|
| KR | 20160054867 | A | 5/2016 |
| KR | 1020160054822 | a | 5/2016 |
| KR | 1020160062646 | A | 6/2016 |
| KR | 1020160076688 | A | 7/2016 |
| KR | 1020180025024 | A | 3/2018 |
| KR | 20190069166 | A | 6/2019 |
| KR | 20200050547 | A | 5/2020 |

* cited by examiner

*Primary Examiner* — Douglas M Menz
(74) *Attorney, Agent, or Firm* — Seed Intellectual Property Law Group LLP

(57) ABSTRACT

The present disclosure relates to a display device, according to an aspect of the present disclosure, the display area includes a substrate which includes a plurality of sub pixels disposed in the display area and each including an emission area and a non-emission area; a thin film transistor disposed on the substrate; a planarization layer which is disposed on the thin film transistor and includes a plurality of grooves overlapping at least a part of the non-emission area; an anode which overlaps an emission area and is disposed on the planarization layer; a bank which is disposed on the planarization layer so as to expose at least a part of the anode and encloses the emission area of each of the plurality of sub pixels; an organic light emitting layer disposed on the anode; and a cathode disposed on the organic light emitting layer, and the bank includes a plurality of concave portion formed so as to overlap the plurality of grooves of the planarization layer.

12 Claims, 7 Drawing Sheets

DISPLAY DEVICE

CROSS-REFERENCE TO RELATED APPLICATIONS

This application claims the priority of Korean Patent Application No. 10-2021-0189459 filed on Dec. 28, 2021 in the Korean Intellectual Property Office, the disclosure of which is incorporated herein by reference.

BACKGROUND

Technical Field

The present disclosure relates to a display device, and more particularly, to a display device which improves the reliability and the display quality by covering a step caused by foreign materials.

Description of the Related Art

Unlike a liquid crystal display device (LCD) which includes a backlight, an organic light emitting display device (OLED) does not require a separate light source. Therefore, the organic light emitting display device can be manufactured to be light and thin and has process advantages and has a low power consumption due to the low voltage driving. First of all, the organic light emitting display device includes a self-emitting element and includes layers formed of organic thin films so that the flexibility and elasticity are superior to the other display devices.

Many layers which configure the organic light emitting display device are formed of organic thin films to be easily deteriorated due to moisture and oxygen from the outside. Accordingly, an encapsulation layer is formed in the organic light emitting display device to cover the organic light emitting diode.

BRIEF SUMMARY

The inventors have realized that, when the encapsulation layer is formed in a state in which foreign materials are introduced, there is a problem in that a step is caused by the foreign materials so that cracks are generated by the encapsulation layer. Specifically, when the encapsulation layer is formed in a state in which foreign materials are introduced, the foreign materials are not covered by the encapsulation layer, which causes a seam around the foreign materials. Specifically, if foreign materials are seated on the side surface of the bank, that is, a tapered portion, the encapsulation layer is cracked due to the seam and the moisture or oxygen easily enters through the crack, which deteriorates the organic light emitting diode.

As described above, the seam due to the foreign materials is easily generated on the side surface of the bank and when the seam is caused, the moisture and oxygen are easily introduced to degrade the reliability of the display device.

A technical benefit to be achieved by the present disclosure is to provide a display device in which the step caused by the foreign materials is covered to minimize or reduce the seam and the reliability and the display quality are improved.

Technical benefits of the present disclosure are not limited to the above-mentioned technical benefits, and other technical benefits, which are not mentioned above, can be clearly understood by those skilled in the art from the following descriptions.

According to an aspect of the present disclosure, a display device which includes a display area and a non-display area adjacent the display area includes a substrate which includes a plurality of sub pixels disposed in the display area and each including an emission area and a non-emission area; a thin film transistor disposed on the substrate; a planarization layer which is disposed on the thin film transistor and includes a plurality of grooves overlapping at least a part of the non-emission area; an anode (or "first electrode") which overlaps an emission area and is disposed on the planarization layer; a bank which is disposed on the planarization layer so as to expose at least a part of the anode and is adjacent the emission area of each of the plurality of sub pixels; an organic light emitting layer disposed on the anode; and a cathode ("or second electrode") disposed on the organic light emitting layer, and the bank includes a plurality of concave portions that overlap the plurality of grooves of the planarization layer.

Other detailed matters of the embodiments are included in the detailed description and the drawings.

According to the present disclosure, a plurality of grooves is formed on a planarization layer corresponding to a side surface portion of a bank in which the seam is easily caused by the foreign materials and thus, a concave portion is provided at the side surface portion of the bank. Therefore, the foreign materials are accommodated in the concave portion provided at the side surface portion of the bank to cover the step caused by the foreign materials. Accordingly, even though the foreign materials are introduced, the formation of the seam is relieved or blocked to minimize or reduce the crack generated in the encapsulation layer. Further, the display device with improved reliability and display quality is provided.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
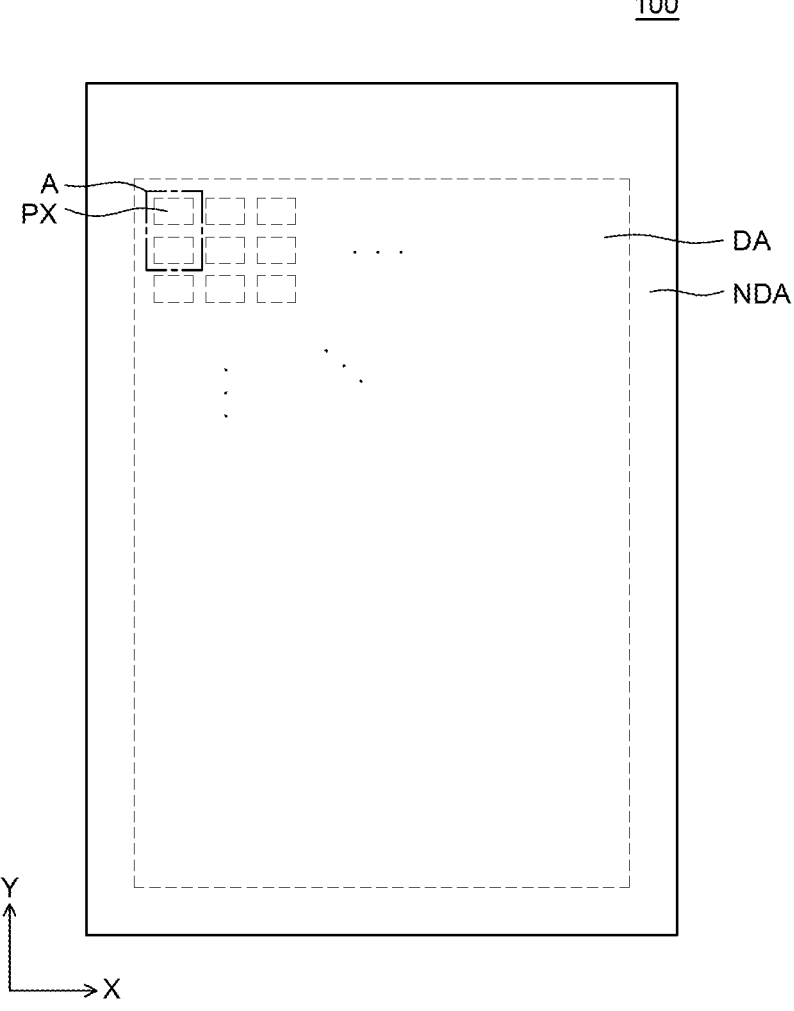
FIG. 1 is a plan view of a display device according to an embodiment of the present disclosure.

Advantages and characteristics of the present disclosure and a method of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, it may be directly disposed on the other element or disposed on the other element with another element interposed therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to embodiments of the present disclosure will be described in detail with reference to accompanying drawings.

Figure 2:
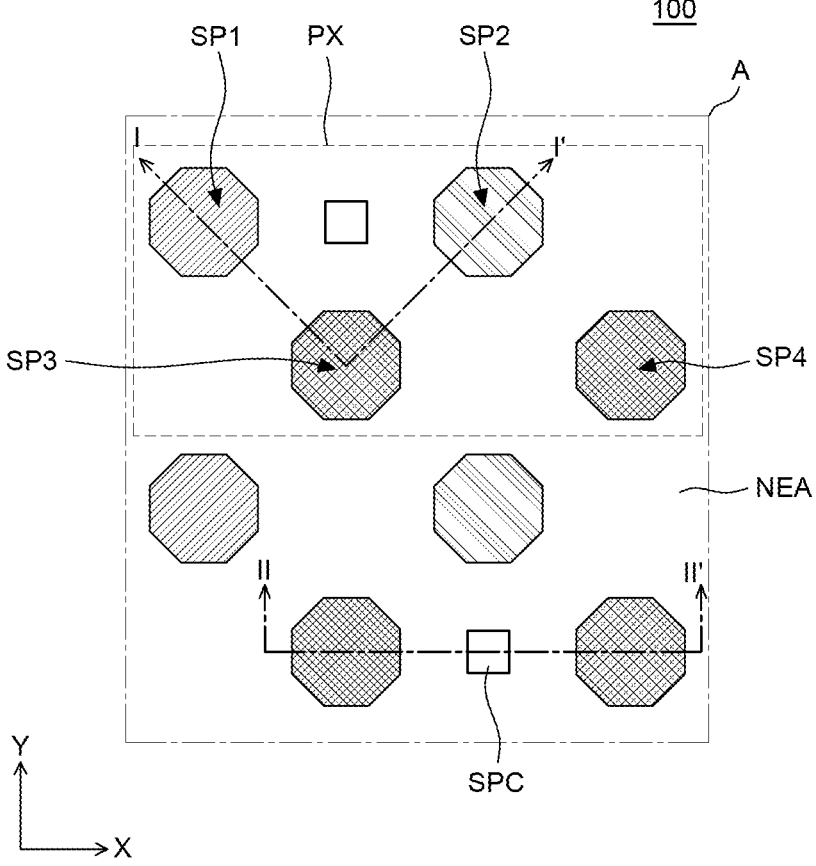
FIG. 2 is an enlarged plan view of an area A of FIG. 1.
Figure 3:
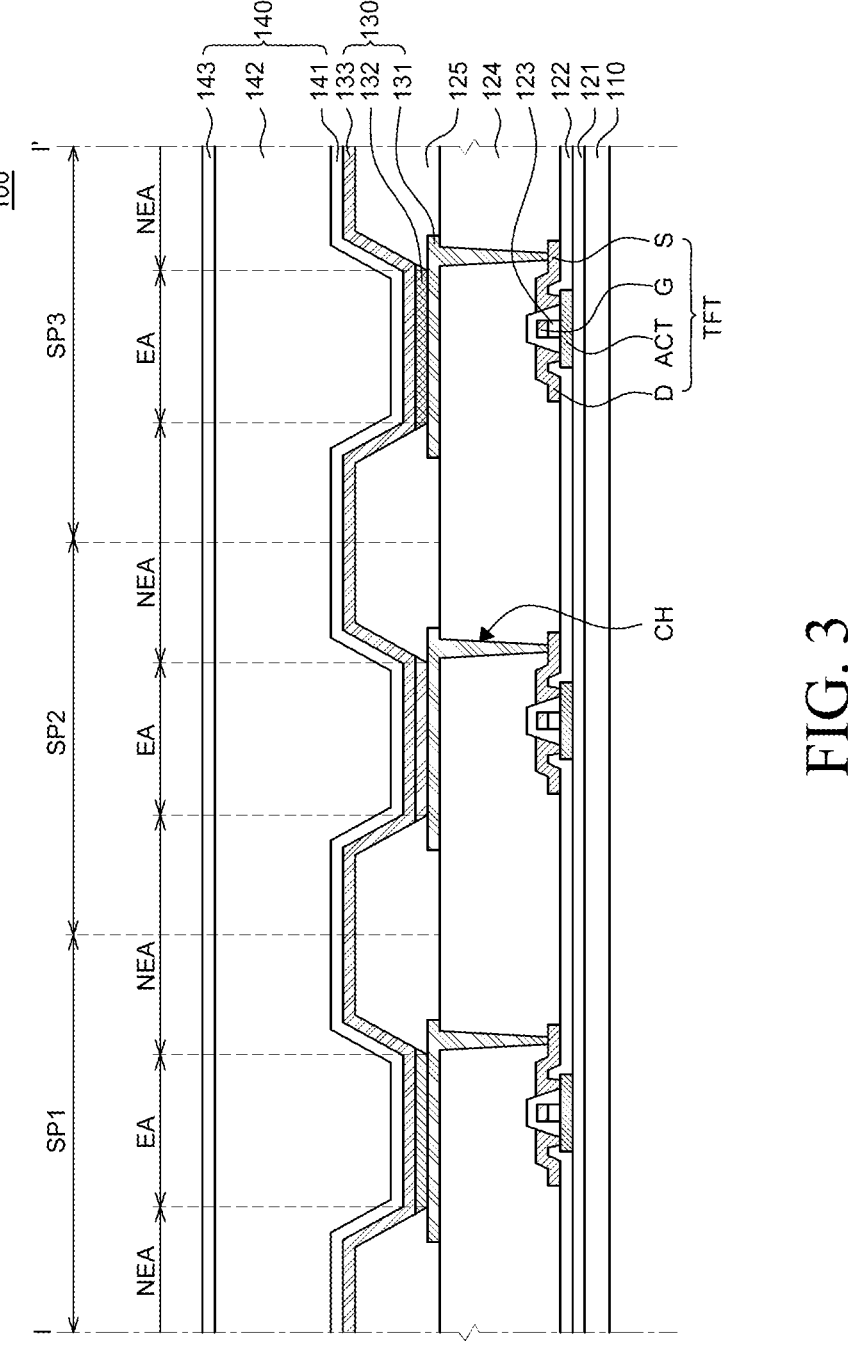
FIG. 3 is a cross-sectional view taken along the line I-I' of FIG. 2.
Figure 4:
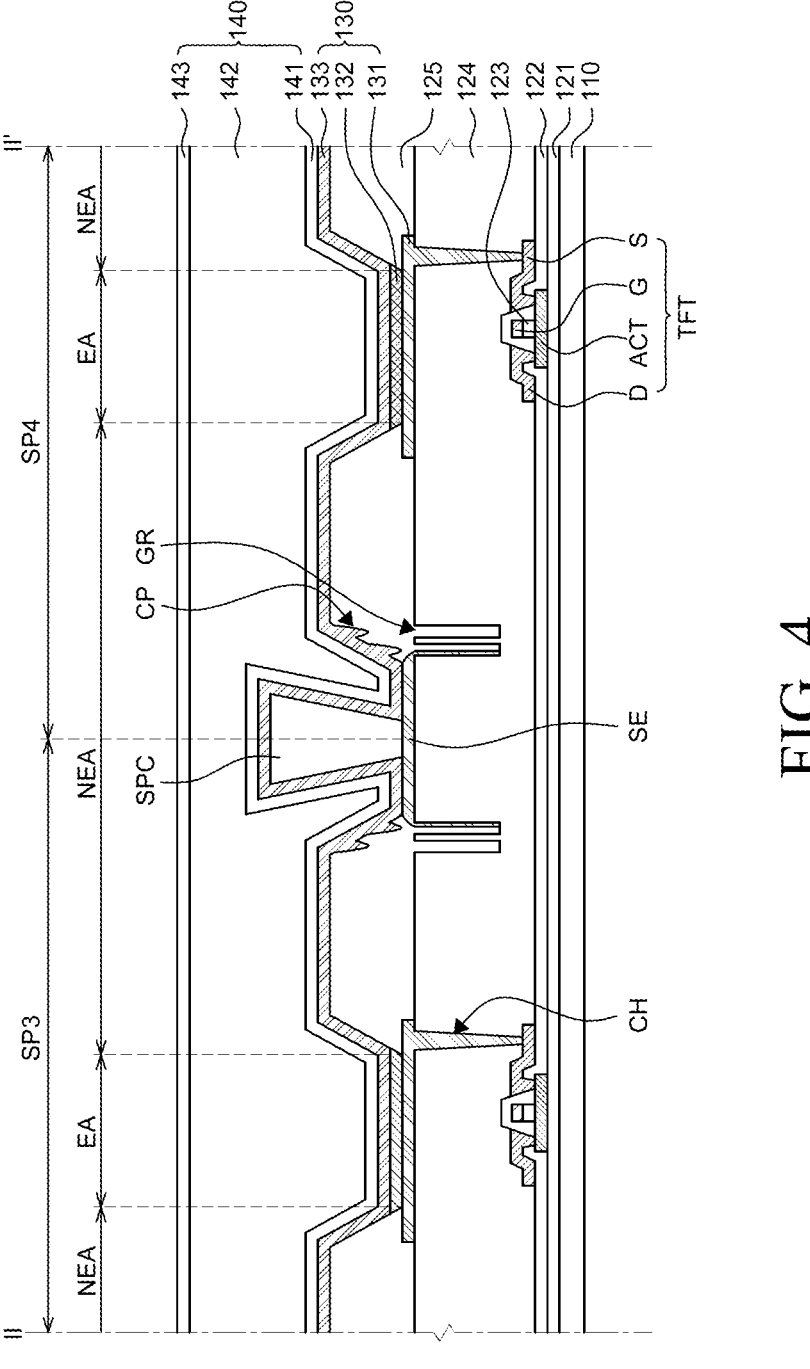
FIG. 4 is a cross-sectional view taken along the line II-II' of FIG. 2.

FIGS. 1 to 4 are views for explaining a display device according to an embodiment of the present disclosure. FIG. 1 is a plan view of a display device according to an embodiment of the present disclosure, FIG. 2 is an enlarged plan view of an area A of FIG. 1, FIG. 3 is a cross-sectional view taken along the line I-I' of FIG. 2, and FIG. 4 is a cross-sectional view taken along the line II-II' of FIG. 2.

Referring to FIGS. 1 to 4, a display device 100 according to an embodiment of the present disclosure includes a substrate 110, a thin film transistor TFT, a planarization layer 124, a bank 125, a spacer SPC, and an organic light emitting diode 130. The organic light emitting diode 130 includes an anode 131, an organic light emitting layer 132, and a cathode 133.

The display device 100 includes a display area DA and a non-display area NDA. The display area DA is an area where a plurality of pixels PX is disposed to display images. In the display area DA, pixels PX including an emission area EA for displaying images and a driving circuit for driving the pixels PX may be disposed. The non-display area NDA encloses (e.g., surrounds on at least four sides) the display area DA. The non-display area NDA is an area where images are not displayed and various wiring lines, driving ICs, and printed circuit boards for driving the pixels disposed in the display area DA and the driving circuits are disposed.

The substrate 110 is a base member which supports various elements which configure the display device and is formed of an insulating material. For example, the substrate 110 may be a glass substrate or a plastic substrate. For example, the plastic substrate may be selected from polyimide, polyethersulfone, polyethylene terephthalate, and polycarbonate, but is not limited thereto.

A plurality of pixels PX is disposed on the substrate 110 corresponding to the display area DA. The plurality of pixels PX is disposed in a matrix and each of the plurality of pixels PX includes a plurality of sub pixels SP1, SP2, SP3, and SP4. The sub pixels SP1, SP2, SP3, and SP4 are elements for respectively displaying one color and include an emission area EA in which light is emitted and a non-emission area NEA in which light is not emitted. In the present specification, an area in which an organic light emitting layer 132 is disposed is referred to as an emission area EA and a remaining area excluding the emission area is referred to as a non-emission area NEA.

One pixel PX may include a first sub pixel SP1, a second sub pixel SP2, a third sub pixel SP3, and a fourth sub pixel SP4. For example, the first sub pixel SP1 and the second sub pixel SP2 are disposed in a first direction (an X-axis direction) and the third sub pixel SP3 and the fourth sub pixel SP4 may be disposed along the first direction to be spaced apart from the first sub pixel SP1 and the second sub pixel SP2 in a second direction (a Y-axis direction), but are not limited thereto.

The first sub pixel SP1, the second sub pixel SP2, the third sub pixel SP3, and the fourth sub pixel SP4 may display different colors and some sub pixels SP1, SP2, SP3, and SP4 may display the same color as needed. Each of the first sub pixel SP1, the second sub pixel SP2, the third sub pixel SP3, and the fourth sub pixel SP4 may be any one of a red sub pixel, a green sub pixel, a blue sub pixel, and a white sub pixel.

A buffer layer 121 may be disposed on the substrate 110 to suppress permeation of oxygen or moisture. The buffer layer 121 may block hydrogen included in the substrate 110 from being introduced into the thin film transistor TFT during a deposition process for forming the thin film transistor TFT. Further, the buffer layer 121 may allow an active layer ACT and an electrode material to be firmly adhered onto the substrate 110. The buffer layer 121 may be formed as a single layer and may be formed with a multilayered structure as needed.

A thin film transistor TFT including a gate electrode G, an active layer ACT, a source electrode S, and a drain electrode D is disposed on the buffer layer 121. The thin film transistor TFT is disposed in each area of the first sub pixel SP1, the second sub pixel SP2, the third sub pixel SP3, and the fourth sub pixel SP4. In the drawing, only a driving thin film transistor TFT, among various thin film transistors TFT which may be included in the display device 100, is illustrated for the convenience of description.

For example, the active layer ACT is disposed on the buffer layer 121 and a gate insulating layer 123 is disposed on the active layer ACT to insulate the active layer ACT and the gate electrode G from each other. Further, an interlayer insulating layer 122 is disposed on the buffer layer 122 to insulate the gate electrode G from the source electrode S and the drain electrode D. The source electrode S and the drain electrode D which are in contact with the active layer ACT are formed on the interlayer insulating layer 122.

The planarization layer 124 may be disposed on the thin film transistor TFT. The planarization layer 124 planarizes an upper portion of the thin film transistor TFT. The planarization layer 124 may include a plurality of contact holes CH which electrically connects the thin film transistor TFT and the anode 131 of the organic light emitting diode 130. Further, the planarization layer 124 includes a plurality of grooves GR so as to overlap at least a part of the non-emission area NEA, which will be described below.

The organic light emitting diode 130 is disposed on the planarization layer 124. The organic light emitting diode 130 is disposed in each area of the first sub pixel SP1, the second sub pixel SP2, the third sub pixel SP3, and the fourth sub pixel SP4. Each organic light emitting diode 130 includes an anode 130, a cathode 133, and an organic light emitting layer 132.

The anode 131 is disposed on the planarization layer 124. The anode 131 is formed on the planarization layer 124 to be separated for each of the first sub pixel SP1, the second sub pixel SP2, and the third sub pixel SP3.

The anode 131 is formed of a conductive material having a high work function to supply holes to the organic light emitting layer 132. The anode 131 may be a transparent conductive layer which is formed of transparent conductive oxide (TCO). For example, the anode 131 may be formed by one or more selected from transparent conductive oxides such as indium tin oxide (ITO), indium zinc oxide (IZO), indium tin zinc oxide (ITZO), tin oxide ($SnO_2$), zinc oxide (ZnO), indium copper oxide (ICO), and aluminum doped zinc oxide (Al-doped ZnO, AZO), but is not limited thereto.

When the display device 100 is configured as a top emission type, the anode 131 may have a structure in which a layer formed of transparent conductive oxide and a reflective layer formed of a metal material are laminated. The reflective layer may be formed of a metal material having a high reflectance to allow light emitted from the organic light emitting layer 132 to be emitted upwardly.

The bank 125 is disposed on the anode 131 and the planarization layer 124. The bank 125 is formed at a border between the plurality of sub pixels SP1, SP2, SP3, and SP4 to divide adjacent sub pixel (SP1, SP2, SP3, and SP4) areas. Further, the bank 125 may divide a pixel (PX) area configured by the plurality of sub pixels SP1, SP2, SP3, and SP4. The bank 125 is disposed so as to enclose the emission area EA of each sub pixels SP1, SP2, SP3, and SP4. Accordingly, the bank 125 suppresses color mixture between adjacent sub pixels SP1, SP2, SP3, and SP4. The bank 125 may be formed of an insulating material to insulate anodes 131 disposed in each sub pixel SP1, SP2, SP3, or SP4 area from each other. Further, the bank 125 may be configured by a material having high light absorption to suppress color mixture between adjacent sub pixels SP1, SP2, SP3, and SP4.

The bank 125 includes a plurality of concave portions CP formed so as to overlap a plurality of grooves GR provided on the planarization layer 124, which will be described below.

An auxiliary electrode SE may be disposed on the planarization layer 124 corresponding to the non-emission area NEA. The auxiliary electrode SE reduces and suppresses the voltage drop caused by a resistance of the cathode 133 and a luminance difference between an outer peripheral portion and a center portion thereby. The auxiliary electrode SE may be disposed between the emission areas EA of each of the plurality of adjacent sub pixels SP1, SP2, SP3, and SP4. The auxiliary electrode SE may be formed of the same material in the same process as the anode 131.

The auxiliary electrode SE may be disposed so as to fill at least a part of a groove adjacent thereto, among a plurality of grooves GR provided on the planarization layer 124. As described above, the planarization layer 124 includes a plurality of grooves GR provided so as to correspond to the non-emission area NEA. The auxiliary electrode SE is formed by depositing an electrode material on the planarization layer 124 provided with the plurality of grooves GR. Accordingly, during the process of depositing the electrode material to form the auxiliary electrode SE, the electrode material may be filled in (e.g., may extend into) some grooves GR adjacent to the auxiliary electrode SE, among the plurality of grooves GR provided on the planarization layer 124. Therefore, the auxiliary electrode SE may be disposed to fill the groove GR adjacent thereto. It should be understood that "disposed to fill" includes the meaning of partially fill, such as is shown in FIG. 4, in which the grooves GR immediately adjacent the spacer SPC have both the auxiliary electrode SE and the bank 125 therein.

At least one spacer SPC may be disposed on the planarization layer 124 corresponding to the non-emission area NEA. The spacer SPC is disposed on the auxiliary electrode SE. The spacer SPC supports the mask during the process of forming the organic light emitting layer 132 using a mask. The spacer SPC may be formed to be higher than the bank 125 so as to support the mask. When the spacer SPC is not disposed, a lower layer may be damaged due to the mask during the process of forming the organic light emitting layer 132. Specifically, in recent years, as an area of the display device is gradually increased and a resolution is increased, a mask having a larger size and a thinner thickness is beneficial. The mask having a large area and a thin thickness may be sagged and bent heavily during the process, so that components in contact with the mask during the process of forming the organic light emitting layer 132 may be damaged. The spacer SPC is in direct contact with the mask provided when the organic light emitting layer 132 is deposited to suppress the damage of the components due to the sagging and bending of the mask. For example, the spacer SPC may be formed of the same material in the same process as the bank 125.

The organic light emitting layer 132 is disposed on the exposed anode 131 without being covered by the bank 125. The organic light emitting layer 132 is a layer in which electrons and holes are coupled to emit light. The organic light emitting layer 132 includes organic light emitting materials having colors corresponding to the first sub pixel SP1, the second sub pixel SP2, the third sub pixel SP3, and the fourth sub pixel SP4. For example, the first sub pixel SP1 is a red sub pixel and an organic light emitting layer 132 corresponding to the first sub pixel SP1 may be formed to include an organic light emitting material which emits red light.

The cathode 133 is disposed on the organic light emitting layer 132 and the bank 125. The cathode 133 may be formed of a metal material having a low work function to smoothly supply electrons to the organic light emitting layer 132. For example, the cathode 133 may be formed of a metal material selected from calcium (Ca), barium (Ba), aluminum (Al), silver (Ag), and alloys including one or more of them, but is not limited thereto.

The cathode 133 is not patterned, but is formed on the organic light emitting layer 132 and the bank 125 as one layer. That is, the cathode 133 is not separated for each of the first sub pixel SP1, the second sub pixel SP2, the third sub pixel SP3, and the fourth sub pixel SP4 to be formed as a continuous single layer. When the display device 100 is driven as a top emission type, the cathode 133 is formed to have a very small thickness to be substantially transparent.

In order to improve luminous efficiency of the display device 100, a hole injection layer, a hole transport layer, an electron transport layer, and an electron injection layer may be further included. For example, the hole injection layer and the hole transport layer may be disposed between the anode 131 and the organic light emitting layer 122 and the electron transport layer and the electron injection layer may be disposed between the organic light emitting layer 132 and the cathode 133.

An encapsulation layer 140 is disposed on the cathode 133 to minimize or reduce deterioration of the organic light emitting diode 130 due to moisture and oxygen. The encapsulation layer 140 planarizes an upper surface of the organic light emitting diode 130. The encapsulation layer 140 may be formed with a multilayered structure in which an inorganic layer formed of an inorganic insulating material and an organic layer formed of an organic material are laminated. For example, the encapsulation layer 140 may be configured by at least one organic layer and at least two inorganic layers and have a multilayered structure in which the inorganic layers and the organic layer are alternately laminated, but is not limited thereto. For example, the encapsulation layer 140 may have a triple layered structure including a first inorganic layer 141, an organic layer 142, and a second inorganic layer 143. For example, the first inorganic layer 141 and the second inorganic layer 143 may be independently formed of one or more selected from silicon nitride (SiNx), silicon oxide (SiOx), silicon oxynitride (SiON), and aluminum oxide ($Al_2O_3$), but is not limited thereto. For example, the organic layer 142 may be formed of one or more selected from epoxy resin, polyimide, polyethylene, and silicon oxycarbide (SiOC), but is not limited thereto.

Hereinafter, a plurality of concave portions CP provided in the bank 125 and a plurality of grooves GR provided in the planarization layer 124 in the display device 100 according to the embodiment of the present disclosure will be described in detail.

The bank 125 and the spacer SPC may be formed by a photolithographic method and specifically, formed by an exposure process and an etching process after applying an organic material on the entire surface of the planarization layer 124 and the anode 131. At this time, a side surface of the bank 125 is formed to have an inclined surface instead of forming vertically to the planarization layer 124, according to the process characteristic.

In the meantime, during the process of manufacturing the display device, the foreign materials may be introduced through various paths. When the encapsulation layer is formed in a state in which the foreign materials are introduced, the foreign materials are not covered by the encapsulation layer due to the step caused by the foreign materials, which causes a defect. Specifically, when the foreign materials are seated on the inclined surface of the bank, the foreign materials are not covered by the encapsulation layer to cause seam around the foreign materials. An area in which the seam is generated has a small thickness so that the moisture or oxygen is easily introduced from the outside and the crack is easily generated to deteriorate the reliability of the display device.

According to the embodiment of the present disclosure, a plurality of concave portions CP is provided at least a part of the inclined side surface of the bank 125. The plurality of concave portions CP is dented downward from the side surface of the bank 125 to be formed to have a valley shape. Accordingly, a side surface of the bank 125 provided with the plurality of concave portions CP may be formed to be saw-toothed. The concave portion CP is formed with a structure dent downward from the side surface of the bank 125 so that the foreign materials introduced during the process are accommodated in the concave portion CP. As described above, when the foreign materials are accommodated in the concave portion CP, the step due to the foreign materials may be relieved. Accordingly, even though the encapsulation layer 140 is formed in a state in which the foreign materials are introduced, the foreign materials are covered by the encapsulation layer 140 to minimize or reduce the seam generation area or suppress the generation of the seam. Consequently, the permeation of the moisture or oxygen is suppressed to improve the reliability and the display quality of the display device.

For example, a depth of each of the plurality of concave portions CP is 0.1 μm to 100 μm and a width may be 0.1 μm to 100 μm. Within this range, even though the foreign materials are introduced, the foreign materials are easily accommodated and the step caused by the foreign materials is effectively relieved to suppress the generation of the seam.

For example, the plurality of concave portions CP may be formed on the inclined side surface of the bank 125 adjacent to the spacer SPC. As described above, the spacer SPC is in contact with the mask in the process of depositing the organic light emitting layer 132 using the mask. At this time, the spacer SPC formed of an organic material has a strength less than the metal mask so that when the spacer is in contact with the mask, the foreign materials may be generated due to the grinding of the spacer SPC. Accordingly, the foreign materials may be more frequently introduced around the bank 125 adjacent to the spacer SPC. As described above, a plurality of concave portions CP may be provided on the side surface of the bank 125 adjacent to the spacer SPC in which the foreign material are prone to be introduced.

Even though in the drawings, it is illustrated that the concave portions CP are provided on the side surface of the bank 125 adjacent to the spacer SPC, it is not limited thereto. The concave portions CP may be formed on the side surface of the bank 125 adjacent to another area in which the foreign materials are frequently introduced. Further, even though in the drawings, it is illustrated that two concave portion CP are provided on the side surface of the bank 125 adjacent to one side surface of the spacer SPC, it is not limited thereto. The number of concave portions CP may be changed in various designs as needed.

The planarization layer 124 includes a plurality of grooves GR so as to overlap at least a part of the non-emission area NEA. Each of the plurality of grooves GR provided in the planarization layer 124 may respectively correspond to one of the plurality of concave portions CP provided on the side surface of the bank 125. When the plurality of grooves GR is formed in the planarization layer 124 and the bank 125 is formed by a photolithographic method, the concave portions CP may be formed on the surface of the bank 125 overlapping the grooves GR. That is, each of the plurality of concave portions CP provided on the side surface of the bank 125 is formed so as to overlap each of the plurality of grooves provided in the planarization layer 124. Accordingly, the position, the number, and the shape of the concave portions CP provided on the side surface of the bank 125 may be adjusted according to the position, the number, and the shape of the corresponding grooves GR provided in the planarization layer 124.

For example, a depth of each of the plurality of grooves GR may be 0.1 μm to 200 μm and a width is 0.1 μm to 100 μm. Within this range, a concave portion G having a desired depth and a desired width may be formed on the side surface of the bank 125.

The display device 100 according to the embodiment of the present disclosure includes a plurality of grooves GR in at least a part of the planarization layer 124 corresponding to the non-emission area NEA and a plurality of concave portions CP provided on the side surface of the bank 125 overlapping the plurality of grooves GR. Accordingly, even though the foreign materials are introduced onto the side surface of the bank 125 in which the seam is easily generated, the foreign materials are accommodated in the concave portion CP to relieve/suppress the generation of the seam. Consequently, a display device 100 with an improved reliability and an improved display quality may be provided.

Figure 5:
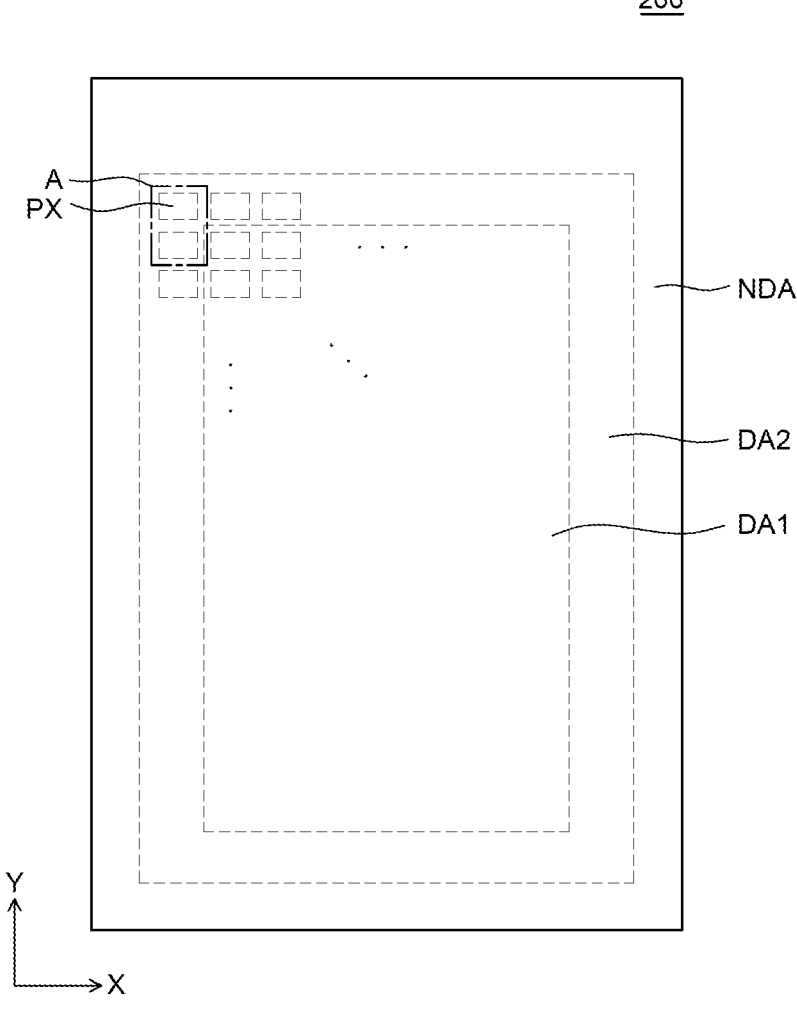
FIG. 5 is a plan view of a display device according to another embodiment of the present disclosure.
Figure 6:
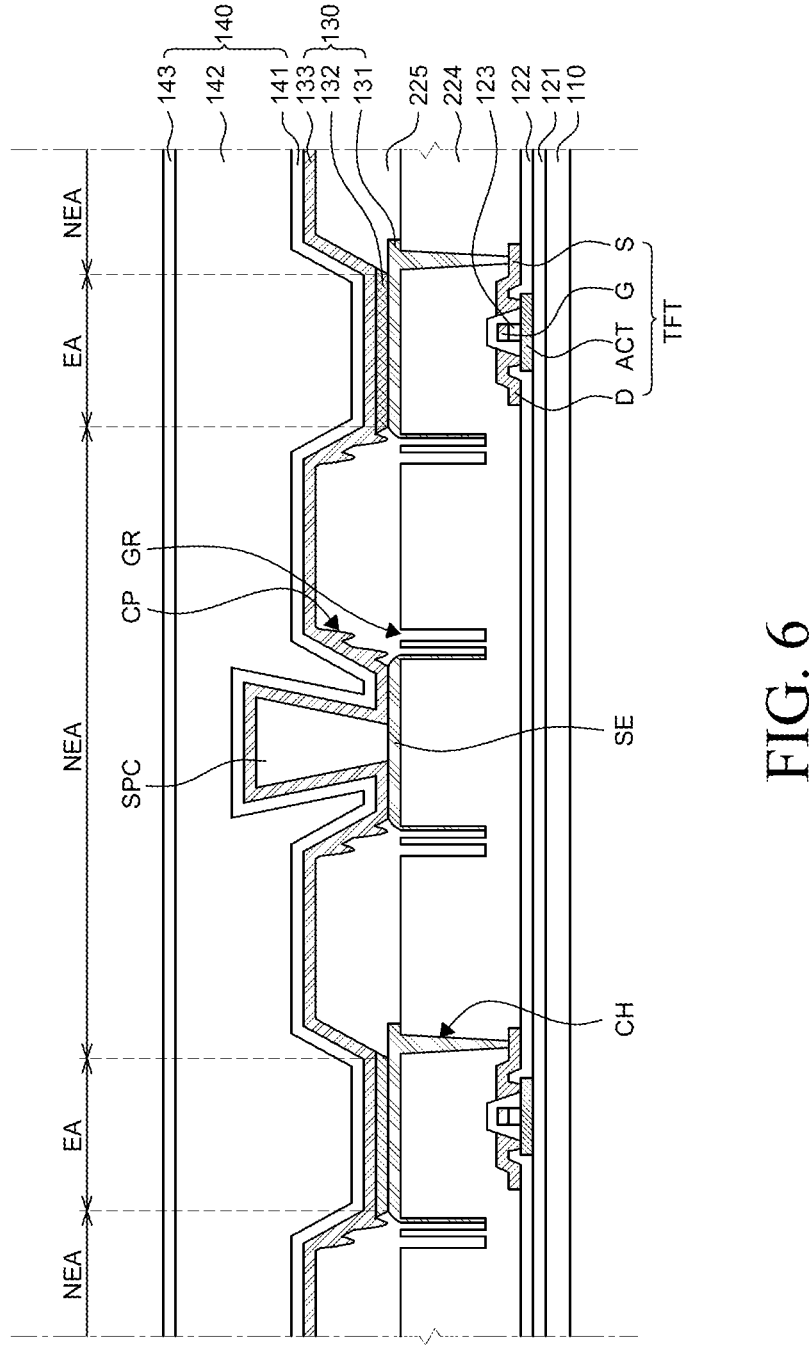
FIG. 6 is a cross-sectional view of a first display area of a display device according to another embodiment of the present disclosure.
Figure 7:
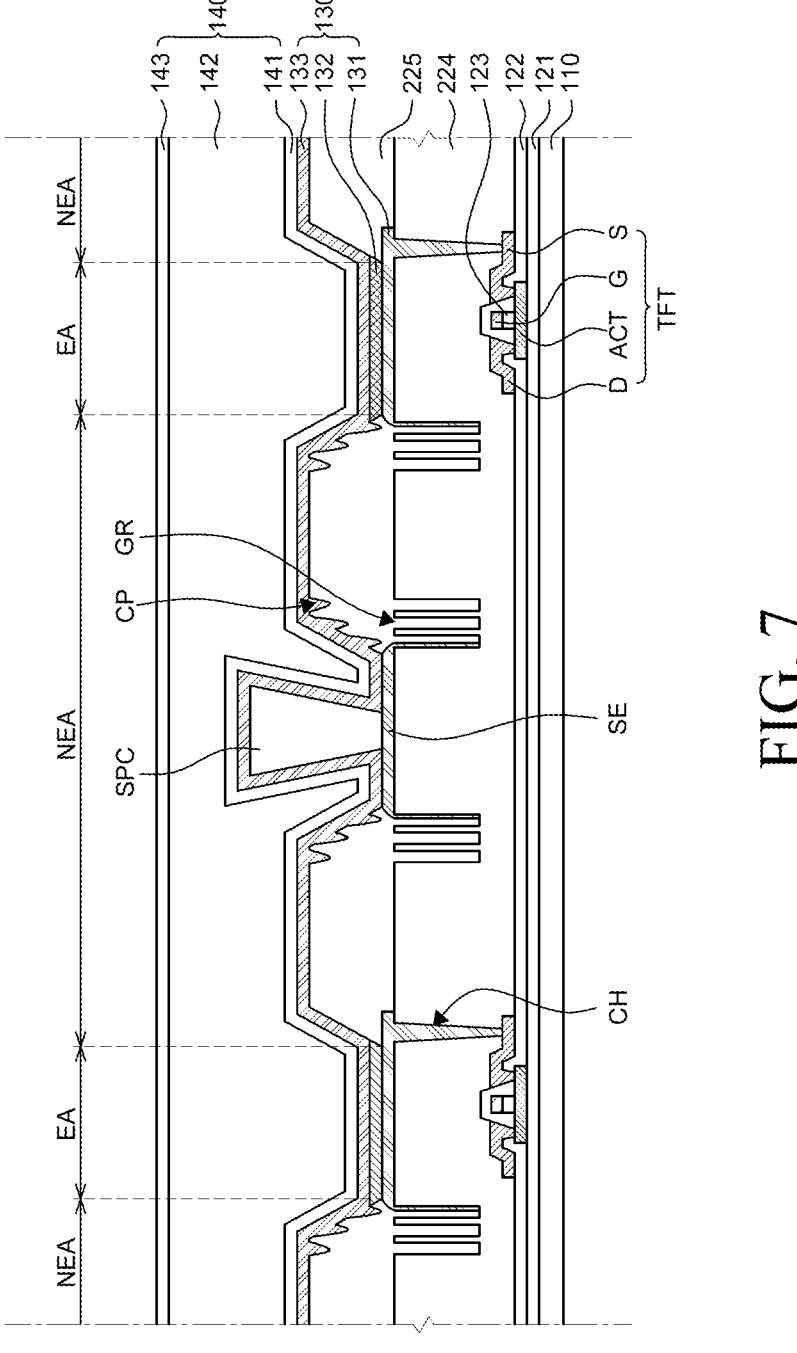
FIG. 7 is a cross-sectional view of a second display area of a display device according to another embodiment of the present disclosure.

FIGS. 5 to 7 are views for explaining a display device according to another embodiment of the present disclosure. FIG. 5 is a plan view of a display device according to another embodiment of the present disclosure, FIG. 6 is a cross-sectional view of a first display area of a display device according to another embodiment of the present disclosure, and FIG. 7 is a cross-sectional view of a second display area of a display device according to another embodiment of the present disclosure.

Referring to FIGS. 5 to 7, a display device 200 according to another embodiment of the present disclosure includes a substrate 110, a thin film transistor TFT, a planarization layer 224, a bank 225, a spacer SPC, and an organic light emitting diode 130. The organic light emitting diode 130 includes an anode 131, an organic light emitting layer 132, and a cathode 133. The display device 200 illustrated in FIGS. 5 to 7 is substantially the same as the display device 100 illustrated in FIGS. 1 to 4 except for structures of the planarization layer and the bank. Accordingly, a redundant description will be omitted.

First, referring to FIG. 5, in the display device 200 according to another embodiment of the present disclosure, a display area may be divided into a first display area DA1 and a second display area DA2. The second display area DA2 encloses the first display area DA1 and is positioned between the first display area DA1 and a non-display area NDA.

In the display device 200 according to another embodiment of the present disclosure, the number of the plurality of grooves GR provided in a planarization layer 224 for every unit area in the first display area DA1 may be different from the number of the plurality of grooves GR provided in the planarization layer 224 for every unit area in the second display area DA2. Hereinafter, this will be described in more detail with reference to FIGS. 6 and 7.

FIG. 6 is a cross-sectional view of the first display area DA1. Referring to FIG. 6, a plurality of grooves GR may be formed in the planarization layer 224 corresponding to the non-emission area NEA. The plurality of grooves GR may be formed to overlap at least a part of an inclined side surface of the bank 225 which does not overlap the contact hole CH.

After forming the planarization layer 224, the anode 132 and an auxiliary electrode SE are deposited so that an electrode material which configures the anode 132 may be filled in a groove GR adjacent to the anode 132, among a plurality of grooves GR provided in the planarization layer 224. Therefore, the anode 132 extends from the emission area EA to the non-emission area NEA and may be disposed to fill the groove GR adjacent to the anode 132. Further, the auxiliary electrode SE is formed of the same material in the same process as the anode 132. Accordingly, an electrode material which configures the auxiliary electrode SE may be filled in the groove GR adjacent to the auxiliary electrode SE, among the plurality of grooves GR.

The bank 225 is disposed on the planarization layer 224 so as to expose at least a part of the anode 131 and the auxiliary electrode SE. A plurality of concave portions CP is provided in at least a part of the side surface of the bank 225. Each of the plurality of concave portions CP is formed so as to overlap each of the plurality of grooves GR provided on the planarization layer 224. Even though in FIG. 6, it is illustrated that two of a plurality of concave portions CP are provided on one side surface of the bank 225, it is not limited thereto.

FIG. 7 is a cross-sectional view of a second display area DA2 of a display device 200 according to another embodiment of the present disclosure. Hereinafter, the second display area DA2 will be described with reference to FIGS. 6 and 7.

A mask is sagged and bent during a process of depositing the organic light emitting layer 132 using the mask. At this time, the sagging and bending of an edge of the mask are more significant so that the second display area DA2 which encloses the first display area DA1 may be more vulnerable to the foreign materials. Therefore, in the second display area DA2 in which the foreign materials are frequently introduced more than the first display area DA1, the plurality of concave portions CP which accommodates the foreign materials may be more densely formed. Accordingly, in the second display area DA2, the number of the plurality of concave portions CP provided in at least a part of the side surface of the bank 225 may be larger than the number of concave portions CP provided in the corresponding position of the first display area DA1.

That is, with respect to the same area, a density of the plurality of concave portions CP provided on the side surface of the bank 225 in the second display area DA2 may be larger than a density of the plurality of concave portions CP provided on the side surface of the bank 225 in the first display area DA1. For example, the number of concave portions CP provided on the side surface of the bank 225 in the second display area DA2 for every unit area may be larger than the number of concave portions CP provided on the side surface of the bank 225 in the first display area DA1 for every unit area. At this time, the unit area may be an area of one pixel PX including a first sub pixel SP1, a second sub pixel SP2, a third sub pixel SP3, and a fourth sub pixel SP4.

For example, as illustrated in FIG. 7, in the second display area DA2, three concave portions CP may be provided on one side surface among side surfaces of the bank 225 provided with the concave portions CP. As described above, in the second display area DA2 which is more vulnerable to the foreign materials than the first display area DA1, the number of the plurality of concave portions CP provided in the bank 225 is formed to be larger, the defect due to the foreign materials may be further reduced.

As described above, the number of concave portions CP provided on the side surface of the bank 225 may be adjusted according to the number of grooves GR provided in the planarization layer 224 overlapping therewith. Accordingly, in order to more densely form the plurality of concave portions CP in the second display area DA2, the plurality of grooves GR may be formed to be more densely in the second display area DA2 than in the first display area DA1. That is, with respect to the same area, a density of the plurality of grooves GR provided in the planarization layer 224 in the second display area DA2 may be larger than a density of the plurality of grooves GR provided in the planarization layer 224 in the first display area DAL For example, the number of grooves GR provided in the planarization layer 224 in the second display area DA2 for every unit area may be larger than the number of grooves GR provided in the planarization layer 224 in the first display area DA1 for every unit area. At this time, the unit area may be an area of one pixel PX including a first sub pixel SP1, a second sub pixel SP2, a third sub pixel SP3, and a fourth sub pixel SP4.

Specifically, for example, a ratio of the number of grooves GR provided in the planarization layer 224 in the second display area DA2 for every unit area to the number of grooves GR provided in the planarization layer 224 in the first display area DA1 for every unit area may be 6:1 to 2:1. However, it is not limited thereto but the density of the groove may vary according to a foreign material introducing degree and a position in which the foreign materials are frequently introduced. For example, when a defect ratio according to the introduction of the foreign material is high according to the structure or a processing method of the display device, a plurality of grooves may be densely formed for the entire display area. In contrast, when the influence of the foreign materials is not large, the plurality of grooves may be less densely formed on the entire display area.

The embodiments of the present disclosure can also be described as follows:

According to an aspect of the present disclosure, a display device which includes a display area and a non-display area enclosing the display area, the display device comprise a substrate which includes a plurality of sub pixels which is disposed in the display area and includes an emission area and a non-emission area; a thin film transistor disposed on the substrate; a planarization layer which is disposed on the thin film transistor and includes a plurality of grooves overlapping at least a part of the non-emission area; an anode which overlaps the emission area and is disposed on the planarization layer; a bank which is disposed on the planarization layer to expose at least a part of the anode and encloses the emission area of each of the plurality of sub pixels; an organic light emitting layer disposed on the anode; and a cathode disposed on the organic light emitting layer, wherein the bank includes a plurality of concave portions formed to overlap the plurality of grooves of the planarization layer.

The plurality of concave portions may be formed on a side surface of the bank.

A side surface of the bank may overlap the plurality of grooves and may be formed to be saw-toothed.

The concave portions may be formed to accommodate foreign materials.

The anode may be disposed to fill at least a part of the groove adjacent to the anode, among the plurality of grooves.

The display device may further comprise at least one spacer disposed on the planarization layer corresponding to the non-emission area.

The display device may further comprise an auxiliary electrode disposed on the planarization layer so as to overlap the spacer.

The auxiliary electrode may be disposed so as to fill at least a part of the groove adjacent to the auxiliary electrode, among the plurality of grooves.

A plurality of concave portions may be formed on a side surface of the bank adjacent to the spacer.

The display area may include a first display area and a second display area which encloses the first display area and may be positioned between the first display area and the non-display area, and the number of the plurality of grooves provided for every unit area in the second display area may be larger than the number of the plurality of grooves provided for every unit area in the first display area.

The number of the plurality of grooves provided for every unit area in the second display area to the number of the plurality of grooves provided for every unit area in the first display area may be 6:1 to 2:1.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/ or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
a substrate having a plurality of sub pixels which is disposed in a display area, each of the plurality of sub pixels including an emission area and a non-emission area;
a thin film transistor disposed on the substrate;
a planarization layer disposed on the thin film transistor;
a first electrode disposed on the planarization layer;
a bank disposed on the planarization layer and the first electrode and exposing at least a part of the first electrode to define the emission area of each of the plurality of sub pixels;

an organic light emitting layer disposed on the first electrode; and a second electrode disposed on the organic light emitting layer, wherein the bank includes a plurality of concave portions formed on an inclined portion of an outer side surface of the bank, wherein the planarization layer includes a plurality of grooves corresponding to and overlapping with the plurality of concave portions of the bank.

2. The display device according to claim 1, wherein the outer side surface of the bank has shape that is saw-toothed.

3. The display device according to claim 1, wherein the concave portions are formed to accommodate foreign materials.

4. The display device according to claim 1, wherein the first electrode is disposed to fill at least a part of the groove adjacent to the first electrode, among the plurality of grooves.

5. The display device according to claim 1, further comprising:

at least one spacer disposed on the planarization layer corresponding to the non-emission area.

6. The display device according to claim 5, further comprising:

an auxiliary electrode disposed on the planarization layer and overlapping the spacer.

7. The display device according to claim 6, wherein the auxiliary electrode is disposed so as to fill at least a part of the groove adjacent to the auxiliary electrode, among the plurality of grooves.

8. The display device according to claim 5, wherein a side surface of the bank adjacent to the spacer includes a plurality of concave portions.

9. The display device according to claim 1, wherein the display device includes a display area and a non-display area adjacent the display area, and wherein the display area includes a first display area and a second display area, the second display area being adjacent the first display area and positioned between the first display area and the non-display area, and the number of the plurality of grooves per unit area in the second display area is larger than the number of the plurality of grooves per unit area in the first display area.

10. The display device according to claim 9, wherein the number of the plurality of grooves per unit area in the second display area to the number of the plurality of grooves per unit area in the first display area is in a range from 6:1 to 2:1.

11. The display device according to claim 1, wherein a depth of each of the plurality of concave portions is 0.1 micrometers ($\mu$m) to 100 $\mu$m and a width of each of the plurality of concave portions is 0.1 $\mu$m to 100 $\mu$m.

12. The display device according to claim 1, wherein a depth of each of the plurality of grooves is 0.1 $\mu$m to 200 $\mu$m and a width of each of the plurality of grooves is 0.1 $\mu$m to 100 $\mu$m.

* * * * *